United States Patent
Yoshima et al.

(10) Patent No.: US 9,628,194 B2
(45) Date of Patent: Apr. 18, 2017

(54) BURST-SIGNAL RECEPTION CIRCUIT

(71) Applicant: MITSUBISHI ELECTRIC CORPORATION, Chiyoda-ku (JP)

(72) Inventors: Satoshi Yoshima, Tokyo (JP); Masaki Noda, Tokyo (JP)

(73) Assignee: Mitsubishi Electric Corporation, Chiyoda-ku (JP)

(*) Notice: Subject to any disclaimer, the term of this patent is extended or adjusted under 35 U.S.C. 154(b) by 0 days.

(21) Appl. No.: 15/124,520

(22) PCT Filed: Jun. 5, 2014

(86) PCT No.: PCT/JP2014/064985
§ 371 (c)(1),
(2) Date: Sep. 8, 2016

(87) PCT Pub. No.: WO2015/186223
PCT Pub. Date: Dec. 10, 2015

(65) Prior Publication Data
US 2017/0019184 A1   Jan. 19, 2017

(51) Int. Cl.
H04B 10/69 (2013.01)
H03F 3/08 (2006.01)
H03F 3/45 (2006.01)
H03L 7/08 (2006.01)

(52) U.S. Cl.
CPC .............. *H04B 10/69* (2013.01); *H03F 3/08* (2013.01); *H03F 3/4508* (2013.01); *H03L 7/0807* (2013.01); *H04B 10/695* (2013.01)

(58) Field of Classification Search
CPC ..... H04B 10/695; H04B 10/69; H03L 7/0807; H03F 3/4508
See application file for complete search history.

(56) References Cited

U.S. PATENT DOCUMENTS 5,539,779 A * 7/1996 Nagahori .............. H04L 25/061
                                                      327/307
6,826,372 B1 * 11/2004 Givehchi .............. H04L 25/063
                                                      398/209
(Continued)

FOREIGN PATENT DOCUMENTS

JP   2001-36470 A   2/2001
JP   2005-184658 A   7/2005
(Continued)

OTHER PUBLICATIONS

International Search Report and Written Opinion issued Aug. 19, 2014 in PCT/JP2014/064985 filed Jun. 5, 2014.
(Continued)

*Primary Examiner* — Sophia Vlahos
(74) *Attorney, Agent, or Firm* — Oblon, McClelland, Maier & Neustadt, L.L.P.

(57) ABSTRACT

A burst-signal reception circuit that receives a differential signal of a burst signal input via a preamplifier. The burst-signal reception circuit includes a differential amplifier to which the differential signal is input via capacitors, an average detection circuit that detects an average of a differential input signal to the differential amplifier, and a differential-offset cancel circuit that operates to cancel a DC voltage level difference of the differential input signal on the basis of output signals of the average detection circuit. Average detection speed of the average detection circuit is configured to be switched according to presence or absence of burst signal reception. The average detection speed is switched to a high-speed side in a head portion of the burst signal and switched to a low-speed side in portions other than the head portion.

6 Claims, 5 Drawing Sheets

(56) References Cited

U.S. PATENT DOCUMENTS

| | | | |
|---|---|---|---|
| 8,165,478 B2* | 4/2012 | Noda | H03G 3/3084 |
| | | | 398/202 |
| 8,395,444 B2* | 3/2013 | Hara | H03G 3/3084 |
| | | | 330/141 |
| 8,653,433 B2* | 2/2014 | Mashimo | H03F 1/083 |
| | | | 250/214 AG |
| 9,203,520 B2* | 12/2015 | Takahashi | H04B 10/695 |
| 2008/0031638 A1* | 2/2008 | Nakamoto | H04B 10/693 |
| | | | 398/202 |
| 2008/0310861 A1 | 12/2008 | Wong et al. | |
| 2009/0142074 A1 | 6/2009 | Ide | |
| 2013/0229231 A1* | 9/2013 | Tanaka | H03F 3/4508 |
| | | | 330/254 |

FOREIGN PATENT DOCUMENTS

| | | |
|---|---|---|
| JP | 2008-312216 A | 12/2008 |
| JP | 2009-111968 A | 5/2009 |
| JP | 2009-135849 A | 6/2009 |
| JP | 2009-278426 A | 11/2009 |
| JP | 2010-166504 A | 7/2010 |
| JP | 2010-278753 A | 12/2010 |
| JP | 2010-278886 A | 12/2010 |
| WO | WO2012/137299 * 10/2012 | H04B 10/693 |

OTHER PUBLICATIONS

Myouraku, et al. "AC-coupled Reset-less 10 Gbps Burst-mode 3R Receiver Using an Internal Scrambling Scheme" OSA/OFC/NFOEC 2011, NTuD3, Mar. 2011 (3 pages).

* cited by examiner

BURST-SIGNAL RECEPTION CIRCUIT

FIELD

The present invention relates to a burst-signal reception circuit.

BACKGROUND

In a one-to-many optical communication system applied with a time division multiplex system, in signals in an uplink direction from one or a plurality of slave station apparatuses to a master station apparatus, packets from the slave station apparatuses are burst signals transmitted at intervals. The master station apparatus that receives such burst signals is generally configured from a photo detector (PD) that converts an optical signal into an electric signal, a transimpedance amplifier (TIA) that converts a current signal of a PD output into a voltage signal, a limiting amplifier (LIA) that amplifies a TIA output to amplitude that can be digitally processed, and a clock and data recovery (CDR) circuit that converts an LIA output into a signal synchronizing a system clock.

In a signal detection circuit in a conventional burst-signal reception circuit, to avoid occurrence of a bit error at the head of a burst reception signal due to an AC transient response, the signal detection circuit and the TIA are connected by DC coupling (e.g., Patent Literature 1 described below) or processing for, for example, filling a no-signal section with an idle signal to prevent the AC transient response from occurring even when the signal detection circuit and the TIA are connected by AC coupling (e.g., Non Patent Literature 1 described below).

In Patent Literature 1, a single-phase output of the TIA output circuit is divided into two. One output is directly input to the LIA and the other output is input to an average detection circuit. An average voltage for differential signal generation is obtained from the average detection circuit. Before an output voltage of the average detection circuit reaches an approximate average of a differential signal, the differential signal cannot be reproduced in the LIA adapted to a burst mode located at a post stage of the average detection circuit. Therefore, a data loss occurs at the burst signal head.

Therefore, in Patent Literature 1, to solve this problem, the data loss amount at the burst signal head is minimized by switching, according to an external reset signal, a high-speed time constant average detection circuit that operates at high speed but has a weak tolerance against identical code succession and a low-speed time constant average detection circuit that operates at low speed but has a strong tolerance against identical code succession.

In Non Patent Literature 1, to avoid a DC voltage drift in the no-signal section, a signal having speed same as the speed of a reception signal and having a high low-frequency cutoff frequency (e.g., a PRBS (Pseudo Random Binary Sequence) 7 signal) is extrapolated to the no-signal section. Consequently, a DC voltage after the AC coupling is always the same as the DC voltage at the time of burst signal reception. Therefore, a DC voltage drift does not occur even if the AC coupling is performed by a capacitor having a large capacity (e.g., 0.1 microfarad). It is possible to reduce a preamble length at the burst signal head.

CITATION LIST

Patent Literature

Patent Literature 1: Japanese Patent Application Laid-Open No. 2008-312216

Non Patent Literature

Non Patent Literature 1: T. Myouraku, S. Takahashi, and A. Tajima, "AC-coupled Reset-less 10 Gbps Burst-mode 3R Receiver Using an Internal Scrambling Scheme," in Proc. OFC/NFOEC 2011, NTuD3, Los Angeles, USA, March 2011.

SUMMARY

Technical Problem

First, when the TIA and the LIA or the LIA and the CDR circuit (hereinafter referred to as "input and output circuits") are connected by the DC coupling, a voltage level needs to be adjusted between the input and output circuits. In particular, in the CDR circuit and subsequent circuits that treat a digital signal, a power supply voltage tends to drop according to the development of the CMOS refining technology in recent years. On the other hand, a power supply voltage of reception circuits up to the LIA has stopped dropping because high speed, high gain, and low noise are requested. A mismatch occurs between the power supply voltages of the circuits. Therefore, in the trend in recent years, a situation occurs in which the DC coupling is physically difficult.

In Patent Literature 1, as explained above, the single-phase output of the TIA output circuit is divided into two. One output is directly input to the LIA and the other output is input to the average detection circuit. An average voltage for differential signal generation is obtained from the average detection circuit.

However, in Patent Literature 1, as it is evident from the description of the specification of Patent Literature 1, tolerance against impedance matching and noise between the input and output circuits decreases for a signal having assumed signal speed of approximately 1.25 Gbps and high speed equal to or higher than 10 Gbps. Therefore, there is a problem in that it is difficult to use the technology of Patent Literature 1 for a high-speed signal.

In Non Patent Literature 1, the processing for filling a no-signal section with an idle signal to connect the LIA and the CDR circuit by AC coupling. However, to perform this processing, it is necessary to perform processing for matching the idle signal and a main signal before the AC coupling. However, in the burst-signal reception circuit, whereas the circuits up to the LIA are mounted in a housing of a transceiver, the CDR circuit and the subsequent circuits are generally formed as an LSI integrated by combining the circuits with a media access control (MAC) processing section. An interface to the transceiver is also generally standardized. Therefore, there is a problem in that the transceiver has to receive a non-general idle signal from the outside and match the idle signal with the main signal.

The present invention has been devised in view of the above and an object of the present invention is to provide a burst-signal reception circuit that can eliminate a data loss at a burst signal head or reduce the data loss to be extremely small even when input and output circuits cannot be connected by DC coupling and AC coupling is necessary.

Solution to Problem

To solve the problems and achieve the object, a burst-signal reception circuit according to the present invention receives a differential signal of a burst signal input via a preamplifier. The burst-signal reception circuit includes a differential amplifier to which the differential signal is input via a capacitor, an average detection circuit that detects an average of a differential input signal to the differential amplifier, and a differential-offset cancel circuit that operates to cancel a DC voltage level difference of the differential input signal on the basis of an output signal of the average detection circuit. Average detection speed of the average detection circuit is configured to be switched according to presence or absence of burst signal reception, and the average detection speed is switched to a high-speed side in a head portion of the burst signal and switched to a low-speed side in portions other than the head portion.

Advantageous Effects of Invention

According to the present invention, it is possible to eliminate a data loss at a burst signal head or reduce the data loss to be extremely small even when input and output circuits cannot be connected by DC coupling and AC coupling is necessary.

DESCRIPTION OF EMBODIMENTS

Burst-signal reception circuits according to embodiments of the present invention are explained below with reference to the accompanying drawings. Note that the present invention is not limited by the embodiments explained below.

First Embodiment

Figure 1:
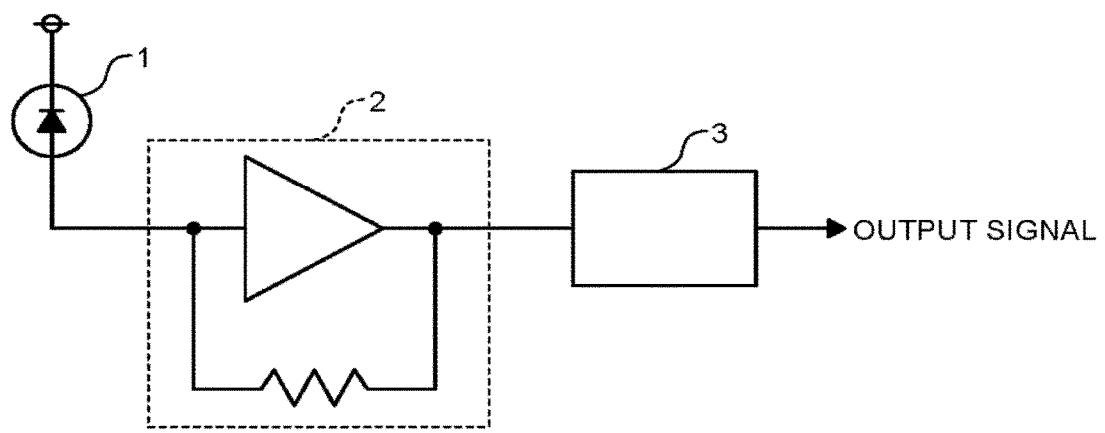
FIG. 1 is a diagram showing a configuration example of a burst signal receiver including a burst-signal reception circuit according to a first embodiment.

FIG. 1 is a diagram showing a configuration example of a burst signal receiver including a burst-signal reception circuit according to a first embodiment. As shown in FIG. 1, a preamplifier 2 (a TIA is illustrated in FIG. 1) converts a current signal flowing to a PD 1 into a voltage signal. A burst-signal reception circuit 3 according to the first embodiment detects a signal component included in the voltage signal and transmits the signal component to circuits at a post stage as an output signal.

Figure 2:
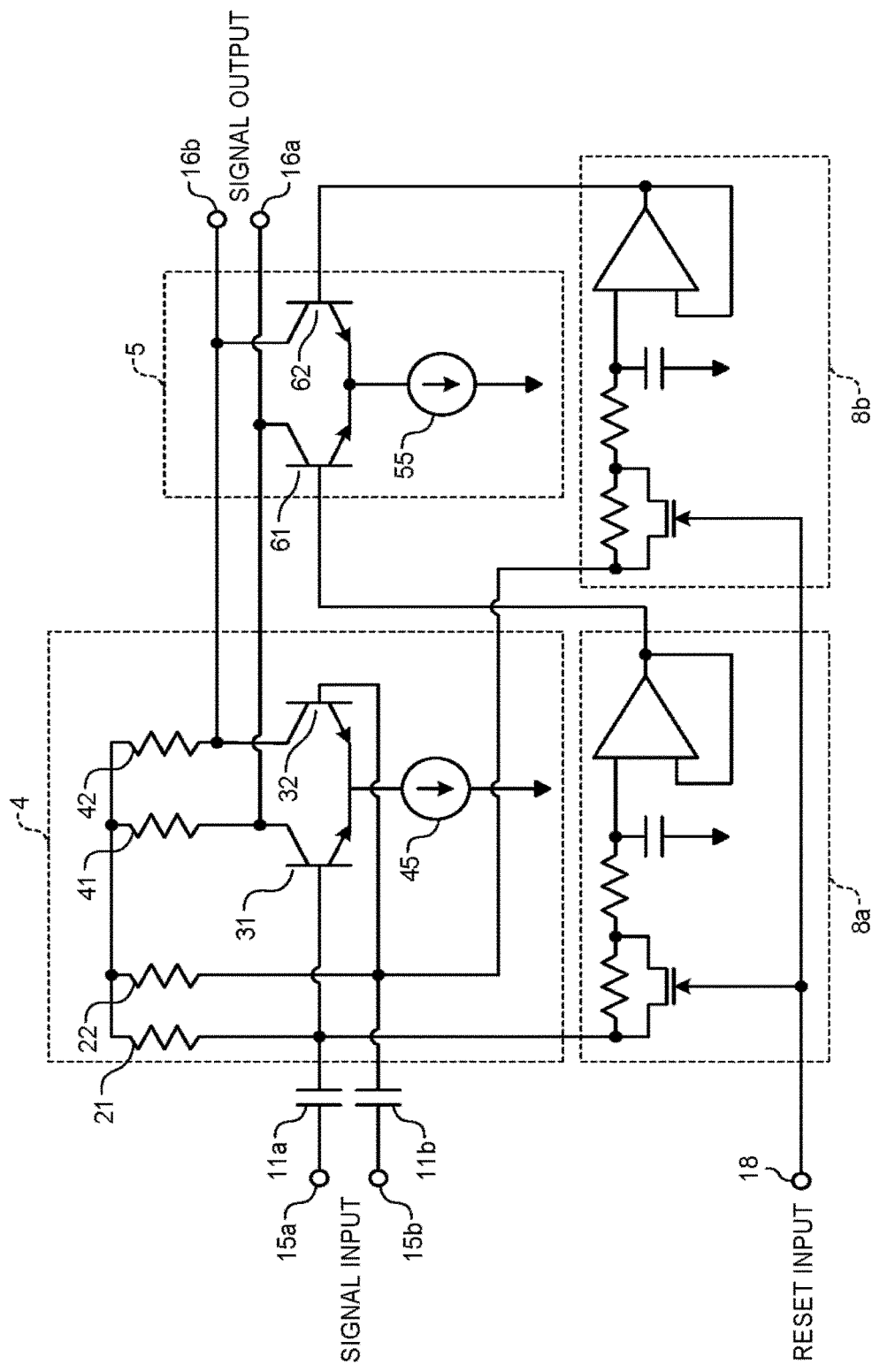
FIG. 2 is a diagram showing a configuration example of the burst-signal reception circuit according to the first embodiment.

FIG. 2 is a diagram showing a configuration example of the burst-signal reception circuit according to the first embodiment. The burst-signal reception circuit 3 according to the first embodiment includes, as shown in FIG. 2, a differential amplifier 4 to which differential input signals from differential-signal input ends 15a and 15b are input via capacitors 11a and 11b that perform AC coupling, an average detection circuit for positive-phase input 8a and an average detection circuit for negative-phase input 8b for detecting an average of the differential input signals, and a differential-offset cancel circuit 5 for cancelling a DC voltage level difference between the differential input signals on the basis of output signals of the average detection circuit for positive-phase input 8a and the average detection circuit for negative-phase input 8b.

The differential amplifier 4 includes input termination resistors 21 and 22, initial-stage differential pair transistors 31 and 32, initial-stage differential pair load resistors 41 and 42, and an initial-stage differential pair current source 45. The differential-offset cancel circuit 5 includes differential pairs for offset cancellation 61 and 62 and a differential-pair current source for offset cancellation 55. In the differential amplifier 4 and the differential-offset cancel circuit 5, to identify the differential pair transistors and the differential pair transistors and the differential-pair power supplies, for convenience, the term "initial-stage" is added to the heads in the differential amplifier 4 and the term "for offset cancellation" is added to the tails in the differential-offset cancel circuit 5. Note that, in FIG. 2, the initial-stage differential pair load resistors 41 and 42 are shown in only the differential amplifier 4. However, the initial-stage differential pair load resistors 41 and 42 can be provided in the differential-offset cancel circuit 5 as well. However, it is effective to configure the initial-stage differential pair load resistors 41 and 42 to be shared by the differential amplifier 4 and the differential-offset cancel circuit 5 as shown in FIG. 2 because the number of components can be reduced. Collector ends of the initial-stage differential pair transistor 31 and the differential pair for offset cancellation 61 and collector ends of the initial-stage differential pair transistor 32 and the differential pair of offset cancellation 62 are respectively connected and configured as differential-signal output ends 16a and 16b. Outputs of the differential-signal output ends 16a and 16b are output signals of the burst-signal reception circuit 3.

Figure 3:
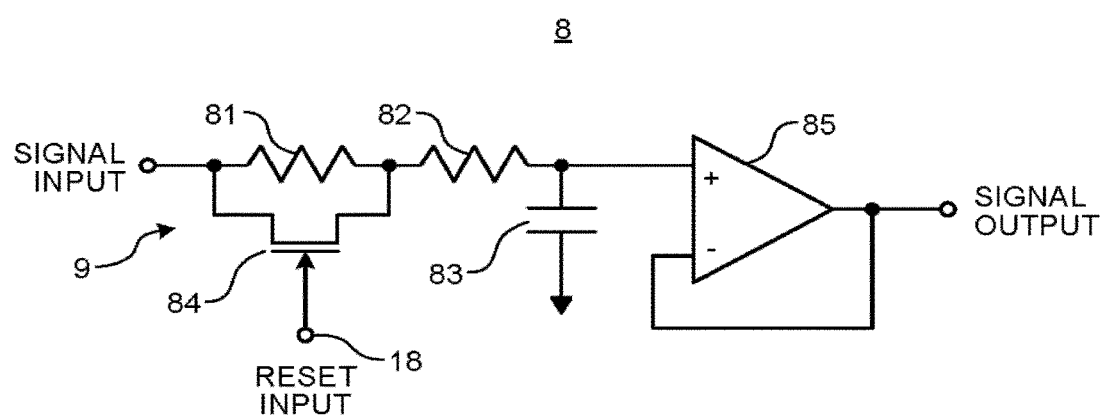
FIG. 3 is a diagram showing a configuration example of an average detection circuit according to the first embodiment.

In FIG. 2, the average detection circuit for positive-phase input 8a and the average detection circuit for negative-phase input 8b have the same circuit configuration. In FIG. 3, only the circuit configuration is shown. In the following explanation, a common circuit section is generally referred to as average detection circuit 8.

In FIG. 3, the average detection circuit 8 includes average-detection-circuit resistors 81 and 82, an average-detection-circuit capacitor 83, a MOS switch 84 for average detection speed switching, and an average-detection-circuit operational amplifier 85. Note that, in FIG. 3, the average detection circuit 8 is configured as a form of a first-order LPF including an operational amplifier. However, the average detection circuit 8 can be configured by an LPF having an order number equal to or larger than a second order or can be configured as a form not including the operational amplifier.

Referring back to FIG. 2, the differential amplifier 4 adopts a configuration of a linear amplifier in which an output signal is obtained even when DC levels of differential input signals do not coincide with each other. Therefore, a resistor can be inserted between emitters of the initial-stage differential pair transistors 31 and 32. Further, in FIG. 2, the initial-stage differential pair transistors 31 and 32 are NPN transistors but can be NMOS transistors. Note that, this embodiment is based on the premise that, to exchange a high-speed signal having speed such as a 10 Gbps, before the AC coupling, buffers, output ends of which are terminated by resistors same as the input termination resistors 21 and 22 like a CML (Current Mode Logic) level, are connected.

Figure 4:
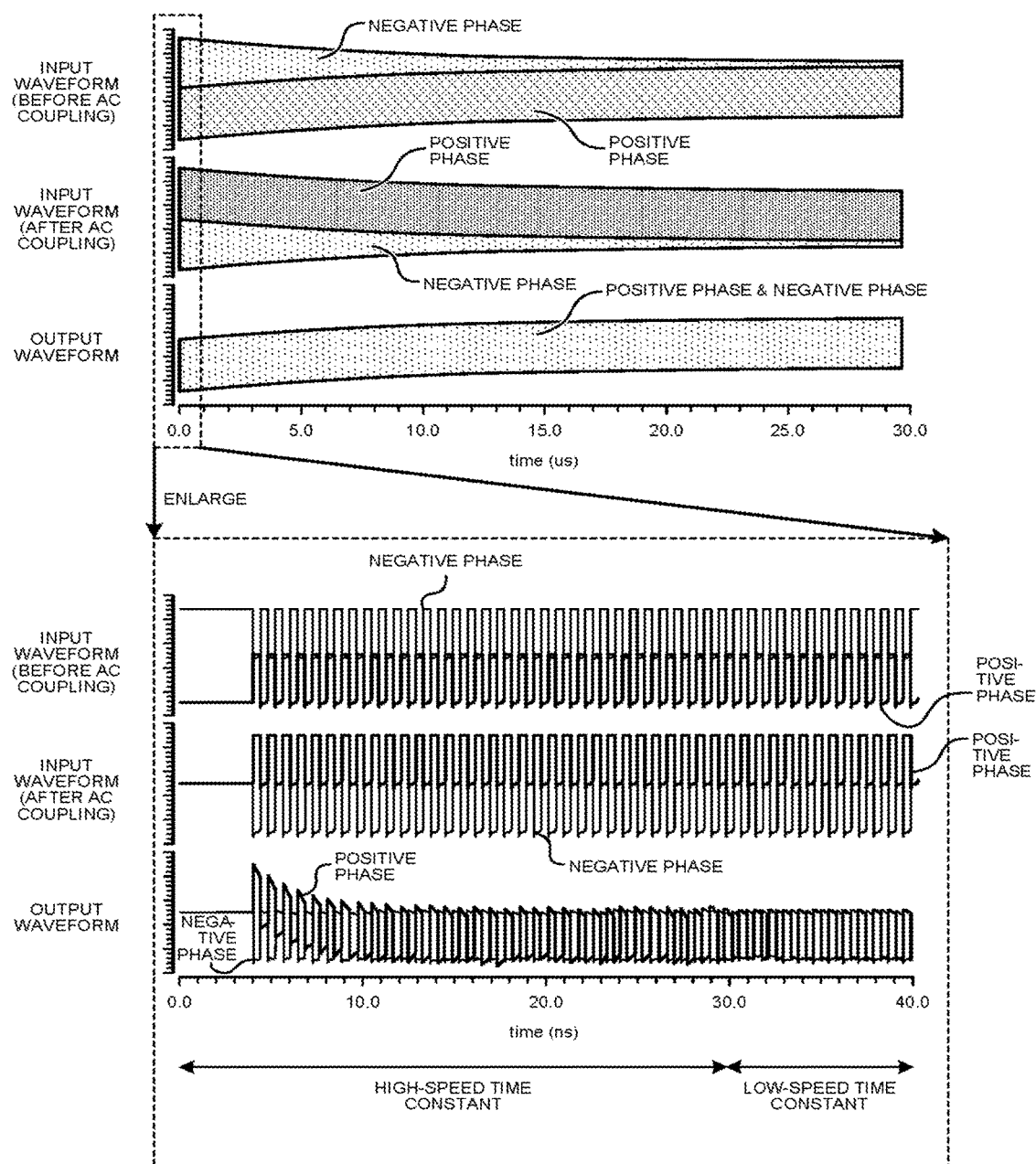
FIG. 4 is a diagram schematically showing main part waveforms for explaining the operation of the burst-signal reception circuit according to the first embodiment.

FIG. 4 is a diagram showing main part waveforms in the burst-signal reception circuit according to the first embodiment. Waveforms at the time when a signal is input after a no-signal section lasts long are shown.

As shown in FIG. 4, immediately before a signal input, before the AC coupling, a DC voltage drift occurs between differential signals. A voltage on a positive-phase output side is low by an amplitude voltage compared with a normal DC voltage level. On the other hand, a voltage on a negative-phase output side is a power supply voltage.

When a power supply voltage on an output side is represented as Vcc1 and a signal amplitude voltage is represented as Vsignal, a positive-phase output voltage is (Vcc1−2×Vsignal) and a negative-phase output voltage is Vcc1 because of the influence of the AC coupling. On the other hand, on an input side of the burst-signal reception circuit after the AC coupling, because the AC coupling has been performed, both positive-phase and negative-phase inputs are the power supply voltage. That is, when a power supply voltage on an input side is represented as Vcc2, both the positive-phase and negative-phase inputs are Vcc2.

From this state, as shown in FIG. 4, for example, when a high-speed signal of 2.5 Gbps is input, before the AC coupling, amplitude starts to occur by Vsignal from (Vcc1−2×Vsignal) on the positive-phase side and amplitude starts to occur by −Vsignal from Vcc1 on the negative-phase side. As a result, both positive-phase and negative-phase signals do not cross in a first bit. However, thereafter, DC levels of the positive-phase and negative-phase signals drift on the basis of a time constant determined by input and output resistances and an AC coupling capacity. Therefore, finally, a signal is output centering on a voltage level of (Vcc1−Vsignal/2). In FIG. 4, termination resistance of 50Ω is used for both of the input and the output. The AC coupling is performed by a capacitor having a capacity of 0.1 microfarad. Therefore, 30 microseconds or more is necessary for convergence.

On the other hand, after the AC coupling, amplitude starts to occur by Vsignal from Vcc2 on the positive-phase side and amplitude starts to occur by −Vsignal from Vcc2 on the negative phase side. As a result, both the positive-phase and negative-phase signals do not cross in the first bit. A signal cannot be reproduced by a differential pair amplifier at the following CDR input stage. Therefore, a bit loss occurs. However, it is possible to reproduce the signal after the differential pair amplifier at the CDR input stage if DC voltage levels of both the positive-phase and negative phase signals coincide with each other after the AC coupling as well. Therefore, it is possible to cancel a DC voltage difference when DC voltage levels between the positive phase and the negative phase shift in the average detection circuit for positive-phase input 8a and the average detection circuit for negative-phase input 8b.

In the present invention, to further reduce the number of bit losses, a circuit configuration is adopted in which a time constant is switched using the average detection circuit 8 and the differential-offset cancel circuit 5. Specifically, the circuit configuration is as explained below.

As shown in FIG. 3, an LOS (Loss of Signal) signal is input to the average detection circuit 8 from the outside through a reset input end 18. The LOS signal is input to the MOS switch 84 for average detection speed switching provided in the average detection circuit 8. The MOS switch 84 becomes conductive, whereby the time constant is switched. That is, the MOS switch 84 operating according to the LOS signal representing presence or absence of burst signal reception operates as a switching circuit 9 for switching the average detection speed of the average detection circuit 8.

In the no-signal section, the MOS switch 84 is short-circuited to reduce resistance. That is, in the no-signal section, the time constant of the average detection circuit 8 is set to high speed and suddenly converged at several bits to several ten bits at the head of a burst signal (see FIG. 3).

On the other hand, after the burst signal can be identified by the LOS signal, the MOS switch 84 is opened to increase the resistance. That is, after the burst signal can be identified, the time constant of the average detection circuit 8 is reduced to low speed. In that case, the time constant is set to speed that can follow an AC response time constant (e.g., speed of ten times of the AC response time constant) determined by the AC coupling and the input/output termination resistance. According to such setting, it is possible to have sufficient tolerance for a signal requested to have tolerance against identical code succession such as a CID (Consecutive Identical Digit) signal while following an AC transient response.

Note that, for example, when the LIA and the CDR are connected by the AC coupling, the LOS signal can be responded at approximately 100 nanosecond or less at most inside the LIA. Therefore, the signal can be used on the CDR circuit side. When the TIA and the LIA are connected by the AC coupling, presence or absence of a signal can be identified by reading an amplitude value inside the TIA. Therefore, the LOS signal generated in that way can be used in the LIA.

An output voltage of the average detection circuit 8 generated by switching the time constant in this way is input to respective bases of the differential pairs of the differential-offset cancel circuit 5, that is, respective bases of the differential pairs for offset cancellation 61 and 62. Consequently, it is possible to adjust an offset level of a differential output voltage of the differential amplifier 4. For example, when a positive phase of a DC voltage level of a differentia input signal (e.g., a voltage on the differential-signal input end 15a side) is high, it is possible to increase a drop voltage amount in the initial-stage differential pair load resistor 41 by increasing a current value on a positive-phase output side of the differential amplifier 4 (a current value flowing to the initial-stage differential pair load resistor 41) and eliminate offset between the differential-signal output ends 16a and 16b.

As explained above, with the burst-signal reception circuit according to the first embodiment, the average detection circuit detects an average of differential input signals to the differential amplifier input via the capacitor. The offset cancel circuit operates to cancel a DC voltage level difference between the differential input signals on the basis of an output signal of the average detection circuit. According to presence or absence of burst signal reception, average detection speed of the average detection circuit is switched to a high-speed side in a head portion of a burst signal and switched to a low-speed side in portions other than the head portion. Therefore, even when the input-output circuits cannot be connected by the DC coupling and the AC coupling is necessary, it is possible to reproduce a signal on a reception side within a preamble time at the burst signal head. It is possible to eliminate a data loss at the burst signal head or reduce the data loss to be extremely small.

If the burst-signal reception circuit according to the first embodiment is used, even if a new circuit is not created in a pre-stage circuit in performing the AC coupling (e.g., on the LIA side when the LIA and the CDR circuits are connected by the AC coupling), it is possible to realize high-speed burst reception by adding a new circuit to only a post-stage circuit side where the AC coupling is requested. Therefore, there is an effect that, even when a pre-stage circuit has already been completed, the pre-stage circuit is not affected.

Second Embodiment

In the first embodiment explained above, the average-detection circuit resistor 81 is disposed in parallel to the MOS switch 84 for average detection speed switching as shown in FIG. 3. The time constant is changed by changing resistance. On the other hand, in the second embodiment, an embodiment is explained in which a change (switching) of a time constant is performed by changing the capacitance of a capacitor rather than the change of the resistance. Note that the configuration of a burst-signal reception circuit is the same as or equivalent to the configuration in the first embodiment except the configurations of the average detection circuit for positive-phase input 8a and the average detection circuit for negative-phase input 8b. The same or equivalent components are denoted by the same reference numerals and signs. Redundant explanation of the components is omitted.

Figure 5:
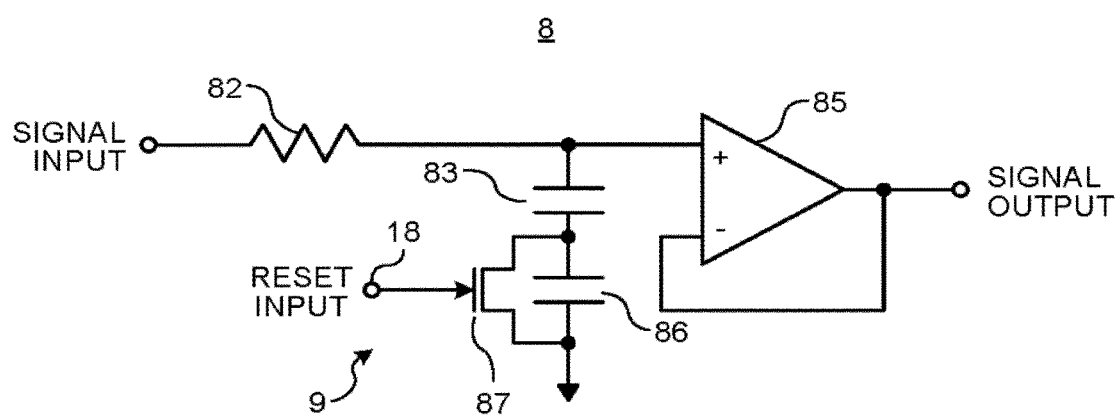
FIG. 5 is a diagram showing a configuration example of an average detection circuit according to a second embodiment.

FIG. 5 is a diagram showing a configuration example of an average detection circuit according to the second embodiment. The average detection circuit 8 according to the second embodiment includes the average-detection-circuit resistor 82, average-detection-circuit capacitors 83 and 86, an MOS switch 87 for average detection speed switching, and the average-detection-circuit operational amplifier 85. The average detection circuit 8 is applied as the average detection circuit for positive-phase input 8a and the average detection circuit for negative-phase input 8b shown in FIG. 2.

Note that, in the configuration shown in FIG. 5, the average detection circuit 8 takes a form of a first-order LPF including the operational amplifier. However, the average detection circuit 8 can be an LPF having an order number equal to or larger than a second order or can be a form not including the operational amplifier.

Most of operations in the second embodiment are the same as the operations in the first embodiment. However, there are differences. Specifically, a difference is that, in the second embodiment, the MOS switch 87 is short-circuited to increase a combined capacity in a no-signal section and, on the other hand, the MOS switch 87 is opened to reduce the capacity in a signal reception section to change a time constant. With this configuration, it is possible to further reduce a bit loss amount at the head of a packet. It is possible to maintain tolerance against identical code succession in a data region of a burst signal.

Third Embodiment

In the first and second embodiments explained above, the resistor or the capacitor is connected in parallel to the MOS switch 84 for average detection speed switching as shown in FIG. 3 or FIG. 5. Resistance or capacitance is changed to change a time constant. On the other hand, in a third embodiment, an embodiment is explained in which both of resistance and capacitance are changed to perform a change (switching) of a time constant. Note that the configuration of a burst-signal reception circuit is the same as or equivalent to the configuration in the first embodiment (or the second embodiment) except the configuration of the average detection circuit for positive-phase input 8a and the average detection circuit for negative-phase input 8b. Same or equivalent components are denoted by the same reference numerals and signs and redundant explanation of the components is omitted.

Figure 6:
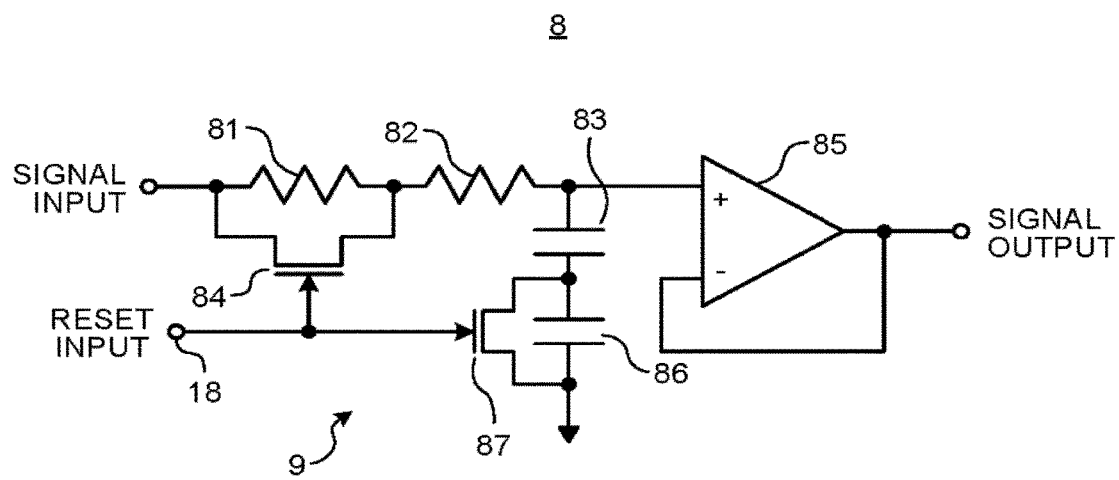
FIG. 6 is a diagram showing a configuration example of an average detection circuit according to a third embodiment.

FIG. 6 is a diagram showing a configuration example of an average detection circuit according to the third embodiment. The average detection circuit 8 according to the third embodiment includes the average-detection-circuit resistors 81 and 82, the average-detection-circuit capacitors 83 and 86, the MOS switches 84 and 87 for average detection speed switching, and the average-detection-circuit operational amplifier 85. The average detection circuit 8 is applied as the average detection circuit for positive-phase input 8a and the average detection circuit for negative-phase input 8b shown in FIG. 2.

Note that, in the configuration shown in FIG. 6, the average detection circuit 8 takes a form of a first-order LPF including the operational amplifier. However, the average detection circuit 8 can be an LPF having an order number equal to or larger than a second order or can be a form not including the operational amplifier.

Most of operations in the third embodiment are the same as the operations in the first or second embodiment. However, there are differences. Specifically, in the third embodiment, in a no-signal section, the MOS switch 84 is short-circuited to reduce resistance and the MOS switch 87 is short-circuited increase a combined capacitance. On the other hand, after a burst signal can be identified, the MOS switch 84 is opened to increase the resistance and the MOS switch 87 is opened to reduce the capacity to change a time constant. With this configuration, compared with the first and second embodiments, it is possible to secure a large difference between a high-speed time constant and a low-speed time constant. It is possible to set a more optimum time constant.

Note that the configurations explained in the first to third embodiments are examples of the configuration of the present invention. It goes without saying that the configurations can be combined with other publicly-known technologies and can be changed by, for example, omitting a part of the configurations in a range not departing from the gist of the present invention.

INDUSTRIAL APPLICABILITY

As explained above, the present invention is useful as a burst-signal reception circuit that can eliminate a data loss at a burst signal head or reduce the data loss to be extremely small even when input and output circuits cannot be connected by DC coupling and AC coupling is necessary.

REFERENCE SIGNS LIST

1 PD (photodetector)
2 preamplifier
3 burst-signal reception circuit
4 differential amplifier 5 differential-offset cancel circuit
8 average detection circuit
8a average detection circuit for positive-phase input
8b average detection circuit for negative-phase input
9 switching circuit
11a, 11b capacitor
15a, 15b differential-signal input end
16a, 16b differential-signal output end
18 reset input end
21, 22 input termination resistor
31, 32 initial-stage differential pair transistor
41, 42 initial-stage differential pair load resistor
45 initial-stage differential pair current source
55 differential pair current source for offset cancellation
61, 62 differential pair for offset cancellation
81, 82 average-detection-circuit resistor
83, 86 average-detection-circuit capacitor
84, 87 MOS switch
85 average-detection-circuit operational amplifier

The invention claimed is:

1. A burst-signal reception circuit that receives a differential signal of a burst signal input via a preamplifier, the burst-signal reception circuit comprising:
a differential amplifier to which the differential signal is input via a capacitor;
an average detection circuit that detects an average of a differential input signal to the differential amplifier; and
a differential-offset cancel circuit that operates to cancel a DC voltage level difference of the differential input signal on the basis of an output signal of the average detection circuit, wherein
an average detection speed of the average detection circuit is configured to be switched according to presence or absence of burst signal reception, and
the average detection speed is switched to a high-speed side in a head portion of the burst signal and switched to a low-speed side in portions other than the head portion.

2. The burst-signal reception circuit according to claim 1, wherein the differential-offset cancel circuit is a differential amplifier having load resistance same as the load resistance of an initial-stage differential amplifier.

3. The burst-signal reception circuit according to claim 1, wherein the average detection circuit is an LPF including a resistor, a capacitor, and an operational amplifier.

4. The burst-signal reception circuit according to claim 1, wherein the average detection speed of the average detection circuit is changed according to switching of resistance.

5. The burst-signal reception circuit according to claim 1, wherein the average detection speed of the average detection circuit is changed according to switching of capacitance.

6. The burst-signal reception circuit according to claim 1, wherein the average detection speed of the average detection circuit is changed according to switching of both of resistance and capacitance.

* * * * *